July 30, 1963 D. E. NELSON 3,099,804

HIGH FREQUENCY NEGATIVE RESISTANCE CIRCUITS

Filed Aug. 23, 1960 3 Sheets-Sheet 1

INVENTOR.
DONALD E. NELSON
BY Eugene M. Whitacre
ATTORNEY

July 30, 1963 D. E. NELSON 3,099,804

HIGH FREQUENCY NEGATIVE RESISTANCE CIRCUITS

Filed Aug. 23, 1960 3 Sheets-Sheet 2

INVENTOR
DONALD E. NELSON
BY Eugene M. Whitacre
ATTORNEY

July 30, 1963 D. E. NELSON 3,099,804

HIGH FREQUENCY NEGATIVE RESISTANCE CIRCUITS

Filed Aug. 23, 1960 3 Sheets-Sheet 3

INVENTOR.
DONALD E. NELSON
BY Eugene M. Whitacre
ATTORNEY

United States Patent Office 3,099,804

Patented July 30, 1963

3,099,804

HIGH FREQUENCY NEGATIVE RESISTANCE CIRCUITS

Donald E. Nelson, Elizabeth, N.J., assignor to Radio Corporation of America, a corporation of Delaware Filed Aug. 23, 1960, Ser. No. 51,369
9 Claims. (Cl. 331—107)

This invention relates to high frequency negative resistance circuits and more particularly to high frequency negative resistance circuits employing tunnel diodes as the active elements.

One form of negative resistance diode, which is known as a tunnel diode, exhibits a positive resistance characteristic for very small forward bias voltages, a negative resistance characteristic for slightly greater values of forward bias voltages, and a positive resistance characteristic for higher values of forward bias voltages. Stated in another manner, as the forward voltage applied to a voltage controlled negative resistance diode is continuously increased from zero, the diode current first increases to a relatively sharp maximum value, then decreases to a relatively deep and broad minimum, and thereafter again increases.

The negative resistance effect in tunnel diodes is due to the quantum mechanical tunneling of electric charges. The motion of the electric charges (majority carriers) is essentially at the speed of light in contrast to the relatively slow motion of minority carriers in transistors. As a consequence, tunnel diodes, unlike transistors, are not limited by transit time effects and can operate at microwave frequencies. When operated at microwave frequencies, it is desirable to utilize distributed circuits such as transmission line resonators, rather than lumped circuit elements, to prevent excessive losses in the circuit due to radiation.

To bias a tunnel diode for stable operation in its negative resistance region requires a voltage source which presents a D.C. resistance to the tunnel diode that is less than the absolute value of the minimum negative resistance of the diode. The voltage source may include a voltage divider with a suitable biasing resistor connected in parallel with the tunnel diode. It has heretofore been proposed that, for high frequency applications, the biasing resistor be connected between the conductors of a straight transmission line at a voltage minimum point at the mean operating frequency so that the resistor has a minimum loading effect on the A.C. circuit. However some loading does occur since the biasing resistor dissipates some small amount of A.C. wave energy which might otherwise be transferred to an output or utilization circuit. Since tunnel diodes at the present state of the art develop only a small amount of power, it is desirable to reduce the loading of the biasing resistor to as low a value as possible.

Accordingly, it is an object of this invention to provide an improved high frequency negative resistance circuit.

It is another object of this invention to provide a high frequency negative resistance diode circuit having an improved biasing circuit.

It is another object of this invention to provide high frequency negative resistance diode circuit having an improved biasing circuit which absorbs a minimum of energy at the frequency of operation.

It is a further object of this invention to provide an improved biasing circuit for a negative resistance diode circuit which is tunable over a broad band of high frequencies with a minimum of energy absorption by the biasing circuit.

A high frequency circuit in accordance with the invention includes a reentrant transmission line structure including a pair of parallel annular conductors, the mean circumference of which is substantially equal to one wavelength at the mean operating frequency of the circuit. A voltage controlled negative resistance device is connected between the transmission line conductors to comprise the active element in the circuit. A bias stabilizing resistor, whose resistance is smaller than the absolute value of the minimum negative resistance of the negative resistance device, is coupled to the transmission line conductors at any arcuate distance spaced from the negative resistance device so that, when a bias voltage is applied through the resistor, the device is stably biased to exhibit a negative resistance. The biasing resistor presents little or no loading on the negative resistance device throughout a broad band of frequencies centered on the mean operating frequency of the circuit.

A similar broad banding effect is accomplished, whether the mean circumference is equal to one wavelength or not, by coupling the stabilizing resistor to the transmission line conductors at a point such that the distance between the negative resistance device and the resistor in one direction minus the distance between them in the opposite direction is equal to one-half of a wavelength at the selected mean operating frequency.

The novel features that are considered characteristic of this invention are set forth with particularity in the appended claims. The invention itself, however, both as to its organization and method of operation as well as additional objects and advantages thereof, will best be understood from the following description when read in connection with the accompanying drawings, in which:

Figure 1:
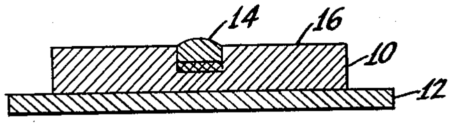
FIGURE 1 is a sectional view of typical negative resistance diode which may be used in circuits embodying the invention.

Reference is now made to the drawing, wherein like components in the various figures thereof have been given like reference numerals, and particularly to FIGURE 1 which is a diagrammatic sectional view of a typical negative resistance diode that may be used in the arrangement of the invention. By way of example, Leo Esaki, Physical Review, vol. 109, page 603, 1958, has reported a thin or abrupt junction diode exhibiting a negative resistance over a region of low forward bias voltages, i.e., less than 0.3 volt. The diode was prepared with a semiconductor having a free charge carrier concentration several orders of magnitude higher than that used in conventional diodes.

A diode which was constructed and could be used in practicing the invention includes a single crystal bar of n-type germanium which is doped with arsenic to have a donor concentration of $4.0 \times 10^{19}$ cm.$^{-3}$ by methods known in the semiconductor art. This may be accomplished, for example, by pulling a crystal from molten germanium containing the requisite concentration of arsenic. A wafer 10 is cut from the bar along the 111 plane, i.e. a plane perpendicular to the 111 crystallographic axis of the crystal. The wafer 10 is etched to a thickness of about 2 mils with a conventional etch solution. A major surface of this wafer 10 is soldered to a strip 12 of a conductor, such as nickel, with a conventional lead-tin-arsenic solder, to provide a non-rectifying contact between the wafer 10 and the strip 12. The nickel strip 12 serves eventually as a base lead. A 5 mil diameter dot 14 of 99 percent by weight indium, 0.5 percent by weight zinc and 0.5 weight percent by weight gallium is placed with a small amount of a commercial flux on the free surface 16 of the germanium wafer 10 and then heated to a temperature in the neighborhood of 450° C. for one minute in an atmosphere of dry hydrogen to alloy a portion of the dot to the free surface 16 of the wafer 10, and then cooled rapidly. In the alloying step, the unit is heated and cooled as rapidly as possible so as to produce an abrupt p-n junction. The unit is then given a final dip etch for 5 seconds in a slow iodide etch solution, followed by rinsing in distilled water. A suitable slow iodide etch is prepared by mixing one drop of a solution comprising 0.55 gram potassium iodide, and 100 cm.$^3$ water in 10 cm.$^3$ concentrated acetic acid, and 100 cm.$^3$ concentrated hydrofluoric acid. A pigtail connection may be soldered to the dot where the device is to be used at ordinary frequencies. Where the device is to be used at high frequencies, contact may be made to the dot with a low impedance lead.

Other semiconductors may be used instead of germanium, particularly silicon and the III–V compounds. A III–V compound is a compound composed of an element from group III and group V of the periodic table of chemical elements, such as gallium arsenide, indium arsenide and indium antimonide. Where III–V compounds are used, the p and n type impurities ordinarily used in those compounds are also used to form the diode described. Thus, sulfur is a suitable n-type impurity and zinc is a suitable p-type impurity which is also suitable for alloying.

Figure 2:
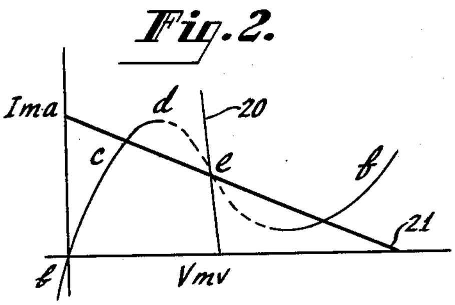
FIGURE 2 is a graph illustrating the current-voltage characteristic of a negative resistance diode of the type shown in FIGURE 1.

The current-voltage characteristic of a typical diode suitable for use with circuits embodying the invention is shown in FIGURE 2. The current scales depend on area and doping of the junction.

For a small voltage in the back direction, the back current of the diode increases as a function of voltage as is indicated by the region *b* of FIGURE 2.

For small forward bias voltages, the characteristic is substantially linear (FIGURE 2, region *c*). The forward current results due to quantum mechanical tunneling. At higher forward bias voltages, the forward current due to tunneling reaches a maximum (region *d*, FIGURE 2), and then begins to decrease. This drop continues (FIGURE 2, region *e*) until eventually normal injection over the barrier becomes dominant and the characteristic turns into the usual forward behavior (region *f*, FIGURE 2).

The negative resistance of the diode is the incremental change in voltage divided by the incremental change in current, or the reciprocal slope of the region *e* of FIGURE 2. To bias the diode for stable operation in the negative resistance region of its characteristic requires a suitable voltage source having a smaller internal impedance than the negative resistance of the diode. Such a voltage source has a D.C. load line 20 as indicated in FIGURE 2, which is characterized by a current-voltage relationship, which has a steeper slope than the negative slope of the diode characteristic and intersects the diode characteristic at only one point. If the voltage source has an internal resistance which is greater than the negative resistance of the diode, the source would have a load line 21 with a smaller slope than the negative slope of the diode characteristic as indicated in FIGURE 2, and would intersect the diode characteristic curve at three points. Under the latter conditions the diode is not stably biased in the negative resistance region. This lack of stability is because an incremental change in current through the diode due to transient or noise currents or the like produces a regenerative reaction which causes the diode to assume one of its two stable states represented by the intersection of the load line 21 with the positive resistance portions of the diode characteristic curve.

Figure 3:
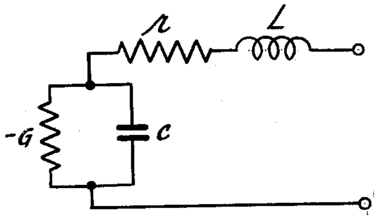
FIGURE 3 is an equivalent schematic circuit diagram of a typical encapsulated negative resistance diode.

The equivalent circuit of a packaged or encapsulated tunnel diode which is biased to an operating point in the negative resistance region is shown in FIGURE 3. Here $-G$ is the negative conductance of the diode, C the junction capacitance, *r* the dissipative resistance and L the package or capsule inductance.

Figure 4:
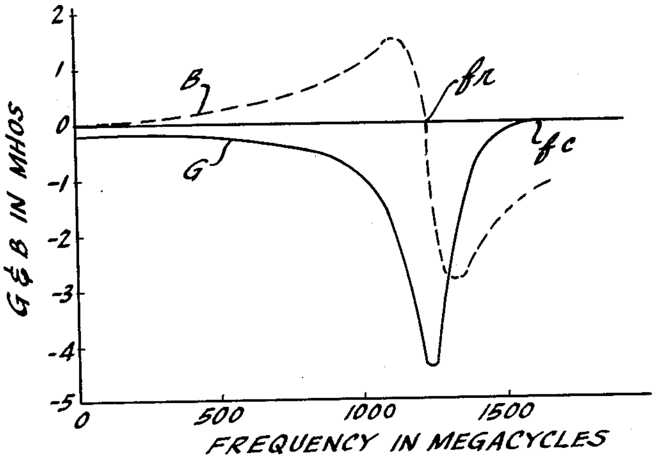
FIGURE 4 is a graph illustrating the variation with frequency of the conductance and the susceptance of an encapsulated negative resistance diode.

A graph of the conductance G and susceptance B characteristics as a function of frequency of an encapsulated tunnel diode is shown in FIGURE 4. The negative values of conductance and susceptance are plotted below the axis of the abscissa and the positive values above it. The frequency $f_r$ is the self-resonating frequency of the encapsulated diode and the frequency $f_c$ is the cut-off frequency, above which the conductance of the diode becomes positive and the diode ceases to act as an active negative resistance device.

Stated briefly, in order for a tunnel diode, which is stably biased to exhibit a negative resistance, to operate in a circuit as a self-excited oscillation generator at a selected frequency, it is necessary that the net susceptance of the circuit equal zero at the selected frequency so that resonance occurs. Additionally the absolute value of the negative conductance of the diode at the selected frequency must exceed the sum of the positive conductances presented by the other circuit components, such as the load and the biasing circuit resistance. For operation as an amplifier, the net susceptance of the circuit at the amplifier resonant frequency must equal zero but the absolute value of the negative conductance of the diode must in this case be less than the sum of the positive conductances of the circuit, which includes a generator or input circuit as well as the load and the biasing circuit.

At high frequencies, transmission lines are utilized to cancel the susceptance of the diode to provide the resonant circuit. Excessive radiation losses which would occur with lumped circuit elements is thereby avoided. Additionally the transformer action of a transmission line solves the difficulty of the loading presented by the bias stabilizing resistor on a tunnel diode circuit. As stated previously, the biasing resistor must be lower in value than the absolute value of the minimum negative resistance of the diode. Consequently the biasing resistor presents a higher conductance than the absolute value of the negative conductance of the tunnel diode which presents the problem of overloading the diode. The present invention describes a circuit wherein the loading is reduced to a minimum. In a circuit constructed in accordance with the invention, the frequency range over which the biasing resistor presents little or no loading is broad. Thus the circuit may be operated as a broad band oscillator or amplifier. Simultaneously a lower frequency range wherein the loading presented by the biasing resistor is very large is also achieved in the circuit.

Figure 5:
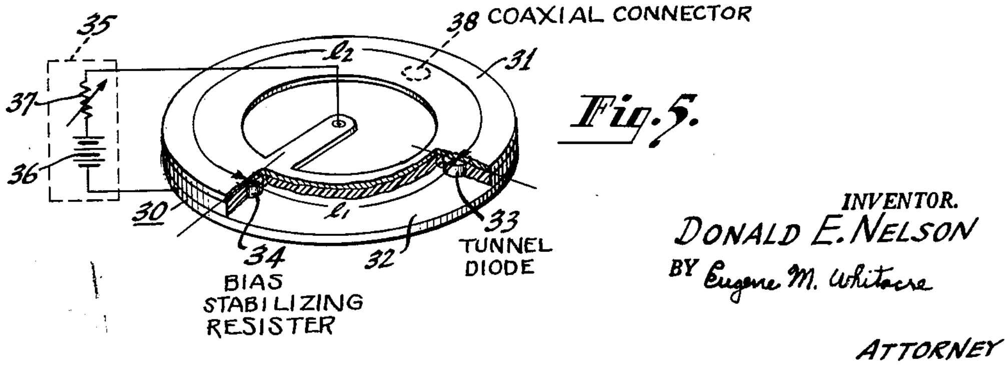
FIGURE 5 is a partially broken perspective view of a high frequency negative resistance diode circuit in accordance with the invention, with the biasing source shown in schematic form.

Referring to FIGURE 5 a high frequency circuit in accordance with the invention includes a reentrant transmission line 30 comprising a pair of parallel annular conductors 31 and 32 separated by suitable insulation means. The mean circumference of the conductors 31 and 32 is made equal to one wave length at the selected mean operating frequency. A tunnel diode 33 is connected between the conductors 31 and 32 to be the active element in the circuit. A bias stabilizing resistor 34 is connected between the conductors 31 and 32 at an arcuate distance $l_1$ from the tunnel diode 33, the arcuate distance $l_2$ being the distance between the diode 33 and the resistor 34 in the opposite direction. The stabilizing resistor 34, which may comprise a block of germanium or graphite, or the like, is chosen to have a lower resistance than the absolute value of the minimum negative resistance of the tunnel diode 33. A suitable biasing voltage source 35, which may comprise a battery 36 and a variable series resistor 37, is connected to the conductors 31 and 32 at the position of the resistor 34 to forward bias the tunnel diode 33 to operate in the negative resistance portion of its current voltage characteristic.

Alternating current wave energy may be coupled from the high frequency circuit by means of a suitable co-axial output connector 38 connected between the conductors 31 and 32 at a suitable point along their circumference. The output connector 38 has an outer conductor that makes electrical contact with the transmission line conductor 32 and an inner conductor that makes electrical contact through an aperture in conductor 32 with the conductor 31. The conductor 32 may be the usual ground plane in microstrip lines.

For illustrative purposes in describing the operation of the circuit of FIGURE 5, it will be assumed that the arcuate distance $l_1$ between the diode 33 and the resistor 34 is equal to one quarter of a wavelength at the selected mean operating frequency. Thus the distance $l_2$ will equal three quarters of a wavelength, since, in accordance with the invention, the condition has been imposed that the sum of the distances $l_1$ and $l_2$ will equal one wavelength at the mean operating frequency. By adjusting the resistor 37, the tunnel diode 33 is biased to operate in the negative resistance region of its characteristic, and will function as the active element in the circuit. Wave energy will be propagated in two directions, one component going clockwise around the transmission line 30 and the other component going counterclockwise. At the resistor 34, which is one quarter of a wavelength away from the diode 33, the two components arrive substantially out of phase with each other, and because of the resultant wave opposition, the components will cancel and the resistor will absorb substantially none of the propagated wave energy and present little or no A.C. (alternating current) loading on the tunnel diode 33.

For ease of explanation, the stabilizing resistor 34 was assumed to be located at a distance from the tunnel diode 33 which equaled one quarter of a wavelength at the operating frequency. However, the resistor 34 could actually be located at any other point in the transmission line 30 and a minimum loading would be presented to the diode 33 so long as the mean circumference of the transmission line is substantially equal to one wavelength at the selected mean operating frequency.

Alternatively if the mean circumference $l$ of the transmission line 30 is not equal to one wavelength at the operating frequency then in accordance with a feature of the invention, the stabilizing resistor 34 should be located at a distance $l_1$ from the tunnel diode 33 such that the relationship $l_2-l_1=\lambda/2$ results, where $\lambda$ is a wavelength at the mean operating frequency. The energy leaving the diode 33 propagates in two directions, that is, in one direction clockwise and in the other direction counterclockwise around the reentrant transmission line 30, and in about equal proportions. At the resistor 34 therefore, the energy component arriving from the clockwise direction has travelled about one-half a wavelength longer than the energy component arriving from the counterclockwise direction, the difference in travel being $l_2-l_1=\lambda/2$. Consequently, these two components arrive out of phase with each other at the resistor 34, and because of the resultant wave opposition, substantially no energy is absorbed by, or passes into, the resistor 34. Thus little or no loading on the diode 33 would occur.

Figure 6:
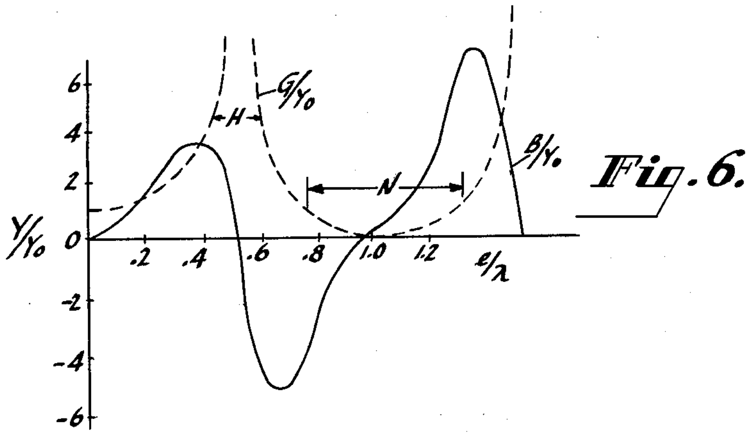
FIGURE 6 is a graph diagrammatically illustrating the normalized admittance characteristic of the circuit shown in FIGURE 5.

A graphic representation of the loading presented to the tunnel diode 33 by the circuit configuration of FIGURE 5 is shown in FIGURE 6. The normalized conductance $G/Y_0$ and the normalized susceptance $B/Y_0$ have been plotted as separate curves for a particular circuit wherein the resistance of the stabilizing resistor 34 equals the characteristic impedance of the transmission line 30 and is located at a physical distance $l_1$ from the diode 33 which is equal to one quarter of the mean circumference $l$, i.e. $l_1=l/4$. The physical distance $l_1$ would therefore be spaced one-quarter of a wavelength away from the diode 33 at the frequency where the mean circumference of the transmission line 30 is equal to one wavelength.

The normalized admittance presented to the tunnel diode 33 by the circuit of FIGURE 5 is given by the equation $$(1)\qquad \frac{Y}{Y_0}=\frac{B^2}{A^2+\left(\frac{Z_0}{R}\right)^2}\frac{Z_0}{R}+jA\left[\frac{B^2}{A^2+\left(\frac{Z_0}{R}\right)^2}-1\right]$$

where $R$=the resistance of the stabilizing resistor 34
$Y_0$=the characteristic admittance of the transmission line 30
$Z_0$=the characteristic impedance of the transmission line 30
$l_1$=the distance from the tunnel diode 33 to the stabilizing resistor 34 in one direction
$l_2$=the distance from the tunnel diode 33 to the stabilizing resistor 34 in the opposite direction
$A$=cotangent $\beta l_1$+cotangent $\beta l_2$
$B$=cosecant $\beta l_1$+cosecant $\beta l_2$
$\beta$=the phase constant of the transmission line 30.

The above Equation 1 lays the mathematical foundation for the curves shown in FIGURE 6.

Referring to FIGURE 6 it may be seen that the conductance or loading presented to the diode is very low over a wide range of frequencies centered about the frequency where the mean circumference $l$ of the transmission line 30 is equal to one wavelength $\lambda$, i.e.

$$\frac{l}{\lambda}=1$$

This region is represented by the letter N in the graph. The lowest conductance occurs at the frequency where the mean circumference $l$ equals one wavelength $\lambda$. Additionally the conductance is very high over a somewhat narrow range centered about a frequency $$\left(\frac{l}{\lambda}=.5\right)$$

which is one half the value of the frequency where the conductance is low. This region is designated by the letter H in the graph.

It is evident that the circuit may be used to provide low conductance over a broad band of frequencies centered about a selected mean frequency, with high conductance being provided in a range of frequencies centered about a frequency which is one half the selected mean frequency. More importantly, the regions of low conductance N and high conductance H may be moved relative to each other by changing the parameters of the circuit and particularly the distance $l_1$ between the tunnel diode 33 and the biasing resistor 34 from $l_1=l/4$ to a different value.

Figure 7:
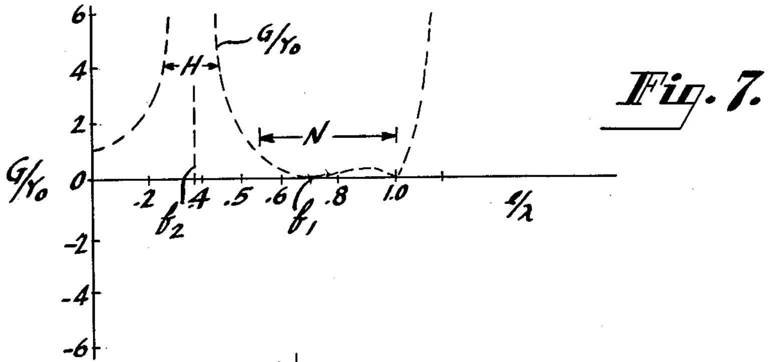
FIGURES 7 and 8 are graphs diagrammatically illustrating the normalized conductance characteristics of the circuit shown in FIGURE 5 with different locations of the biasing resistor.

With the same circuit component values as those used to obtain the graph of FIGURE 6, the relative location of the regions of low and high conductance, for the instance where the bias stabilizing resistor 34 is placed at a distance $l_1$ from the diode 33 which is less than $l/4$, is shown in FIGURE 7. The region of low conductance has been narrowed and a minimum conductance no longer occurs only at the frequency corresponding to $l/\lambda=1$ but also occurs at a lower frequency $f_1$. Similarly the region of high conductance is now centered on a frequency $f_2$ below that of the frequency corresponding to $l/\lambda=.5$.

Figure 8:
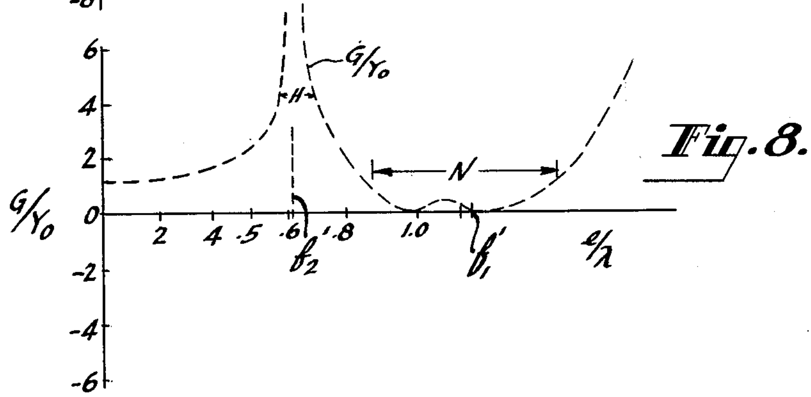

In FIGURE 8, the change that occurs when the distance $l_1$ is greater than $l/4$ is shown. The conductance curve has been broadened and a minimum conductance not only occurs at the frequency $l/\lambda$ equals one but also at a higher frequency $f_1'$. Similarly the frequency $f_2'$ wherein the conductance is the highest occurs at a frequency above that corresponding to $l/\lambda=.5$.

Therefore it is apparent that there is a large amount of flexibility in choosing the frequencies wherein the high and low conductance regions occur. This of course is particularly important if operation of the circuit is desired above the self-resonant frequency $f_r$ of an encapsulated tunnel diode. Since the diode would tend to oscillate at this frequency, a high conductance or loading is desired at the self-resonant frequency. If the selected frequency of operation is above the self-resonant frequency of the encapsulated diode, a circuit constructed in accordance with the invention would reduce the possibility of undesired oscillations.

One method of designing the circuit is now described. Knowing the frequency at which operation is desired and the minimum negative resistance of a tunnel diode, a biasing resistor is chosen with a value lower than the absolute value of the minimum negative resistance of the diode. The susceptance of the encapsulated diode at the selected operating frequency is obtained from a graph similar to FIGURE 4. A characteristic impedance equal to the value of the stabilizing resistor may then be selected. Knowing the characteristic impedance desired, the width of a transmission line, of known characteristics such as microstrip, is calculated from well known formulas to obtain this impedance. The length of transmission line needed to balance out the susceptance of the diode to provide a resonant circuit is then obtained by using an impedance diagram for transmission lines, such as the Smith chart. Knowing the length of transmission line necessary to produce resonance at the selected operating frequency, a mean circumference substantially equal to one wavelength at the selected operating frequency is derived. The biasing resistor is then placed in the transmission line at a distance from the diode such that the region of high conductance occurs at the self-resonating frequency of the diode and the region of low conductance occurs at the selected operating frequency.

The flexibility of the circuit in fixing the frequencies at which high and low conductance occur may be enhanced by coupling in parallel with the encapsulated diode a small length of straight transmission line conductors. The susceptance that is added in parallel with the tunnel diode changes the length of the reentrant transmission line that would be needed to produce resonance in the circuit.

Figure 9:
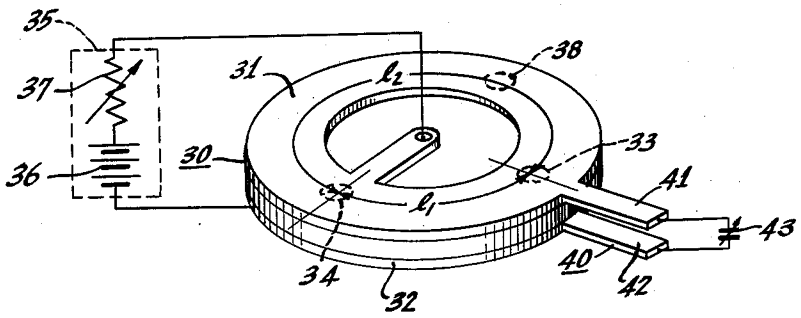
FIGURE 9 is a perspective view of a tunable high frequency negative resistance circuit embodying the invention.

Additionally since the region of low conductance occus over such a broad band of frequencies, a broadband tunable amplifier or oscillator is provided in accordance with the invention. A method of tuning may be seen by referring to FIGURE 9 wherein the same reference numerals have been given to components like those in FIGURE 5. A tuning stub line 40 including a pair of opposed parallel conductors 41 and 42 are connected to the transmission line conductors 31 and 32 in parallel with the tunnel diode 33. The conductors 41 and 42 are terminated by a variable capacitor 43. The tuning line 40, whose length is electrically changed by varying the capacitance of the capacitor 43, changes the susceptance presented to the diode 33 thereby making the circuit tunable over a range of frequencies.

Figure 10:
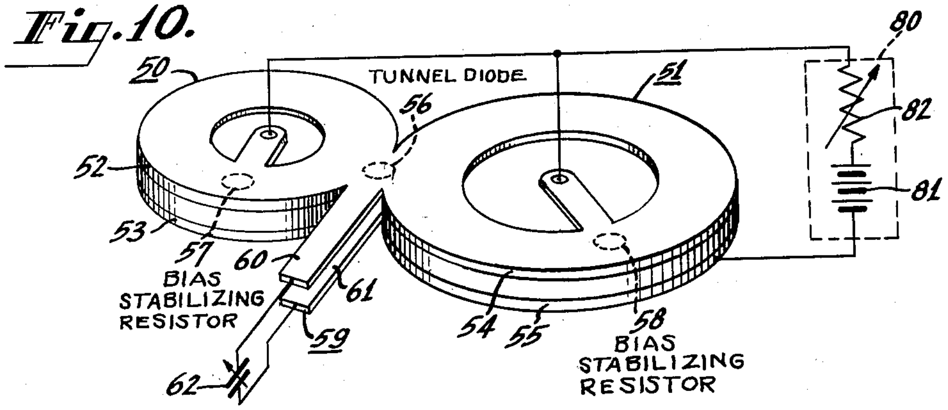
FIGURE 10 is a perspective view of an embodiment of the invention wherein a plurality of reentrant transmission lines are connected in parallel in accordance with the invention; and, FIGURE 11 is a schematic view of a radial resonant circuit employing a negative resistance diode as the active element.

As shown in FIGURE 10, a pair of reentrant transmission lines 50 and 51 having different mean circumferences may be connected in parallel if desired. The transmission line 50 includes a pair of parallel annular conductors 52 and 53 while the transmission line 51 includes a pair of similar conductors 54 and 55. A portion of each transmission line 50 and 51 is in common with the other at their junction. A tunnel diode 56 is connected at the junction of the transmission lines 50 and 51 to comprise the active element in both transmission lines. A bias stabilizing resistor 57 is connected between the conductors 52 and 53 and a similar resistor 58 of substantially the same value as resistor 57 is connected between the conductors 54 and 55. A tuning stub line 59 including a pair of parallel conductors 60 and 61 is connected substantially at the junction of the transmission lines 50 and 51 in parallel with the diode 56. A variable capacitor 62 terminates the tuning line 59. A biasing voltage source 80 including a battery 81 and a series of variable resistor 82 are connected across the biasing resistor 57 in the reentrant transmission line 50 and across the biasing resistor 58 in the reentrant transmission line 51.

The tunnel diode 56, when biased to exhibit a negative resistance by adjusting the variable resistor 82, functions as the active element in both circuits. The selected mean frequency of operation will be determined by the susceptances of the reentrant transmission lines 50 and 51 and the tuning stub line 59. The circuit may be tuned over a frequency range by varying the capacitance of the capacitor 62 thereby changing the susceptance in parallel with the diode 56 and making it resonant at a different frequency and thereby tunable.

The circuits may be designed so that they both present low conductance in the desired frequency range and high conductance at other frequencies. The various combinations that are possible for obtaining low conductance in the desired frequency range of operation are numerous. For example, the transmission lines 50 and 51 could have different characteristic impedances as well as different mean circumferences. The bias stabilizing resistors 57 and 58 could be spaced at various and differing distances around the transmission lines 50 and 51 respectively. Additionally other reentrant transmission lines may also be added in parallel if desired.

Figure 11:
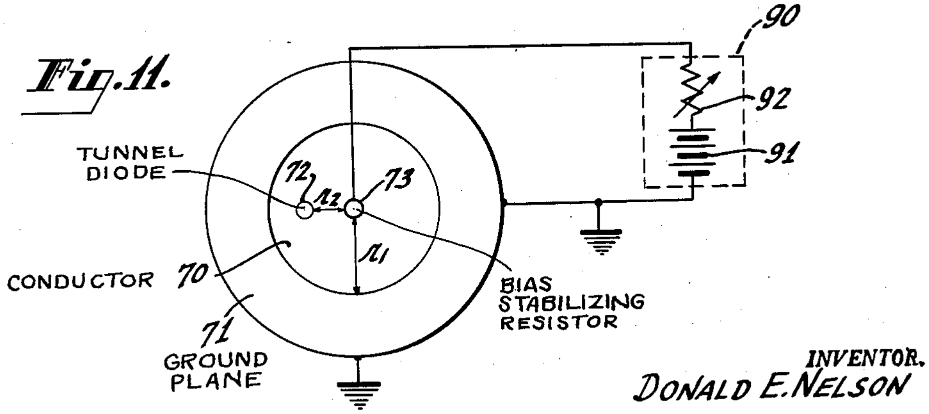

Referring to FIGURE 11, a pair of opposed disc shaped, parallel conductors 70 and 71 separated by suitable insulation means, are provided to comprise a radial resonant circuit for a tunnel diode 72. The conductor 71 is grounded to provide a ground plane and the conductor 70 has a given radius $r_1$. A stabilizing resistor 73 is connected at the center of the conductors 70 and 71 and the tunnel diode 72 is connected between these conductors at a radial distance $r_2$ from the resistor 73. The distance $r_2$ is selected to be one quarter of a wavelength at the resonant frequency of the radial circuit but this distance is not critical. A voltage biasing source 90 including a battery 91 and a series variable resistor 92 are coupled to the conductors 70 and 71 at the position of the biasing resistor 73.

The radius $r_1$ is chosen to present the susceptance value required to resonate with the susceptance of the diode 72 at the selected operating frequency. The distance $r_2$ being substantially one quarter of a wavelength at the selected operating frequency causes the conductance of the resistor 73 to be transformed to a low value by the well known transformation characteristics of a quarter wave section of a transmission line and thus minimum loading is presented to the diode 72 by the resistor 73. Since wave energy in a radial resonant circuit is propagated radially rather than circumferentially, the position of the diode 72 and the resistor 73 may be interchanged with similar results obtainable.

Additionally the circuit permits the paralleling of a plurality of tunnel diodes with similar or even dissimilar susceptance characteristics to obtain a greater power output. If the diodes are similar, then the biasing resistor 73 is placed at the center of the conductors 70 and 71 and all of the diodes would be spaced at the same radial distance from the resistor 73. If the diodes have dissimilar susceptance characteristics, they would be spaced at different radial distances from the resistor 73. The radial distance for each particular diode from the resistor 73 would be determined by the susceptance necessary so balance or cancel the susceptance of the particular tunnel diode in order to achieve resonance. Therefore the radial distance for each dissimilar diode would be different.

What is claimed is:

1. A high frequency circuit having a predetermined mean operating frequency comprising in combination a resonant reentrant transmission line including a pair of annular conductors, said conductors having a mean circumference which is substantially equal to one wavelength at the said predetermined mean operating frequency, an active element comprising a voltage controlled negative resistance device coupled to said transmission line and a resistor coupled to said transmission line at a spaced arcuate distance from said negative resistance device and adapted for receiving a bias voltage to bias said device to exhibit a negative resistance.

2. A high frequency signal translating circuit having a predetermined mean operating frequency comprising a resonant reentrant transmission line including a pair of parallel annular conductors, said conductors having a mean circumference which is substantially equal to one wavelength at said predetermined operating frequency, a voltage-controlled negative resistance diode coupled to said transmission line, a resistor coupled to said transmission line at a spaced circumferential distance from said diode and adapted for receiving a bias voltage to bias said diode to exhibit a negative resistance, said resistor having a resistance value smaller than the absolute value of the minimum negative resistance of said diode.

3. A high frequency signal translating circuit having a predetermined mean operating frequency comprising in combination, a resonant reentrant transmission line having a given characteristic impedance, said transmission line including a pair of annular conductors having a mean circumference which is substantially equal to one wavelength at said predetermined operating frequency, a voltage-controlled negative resistance diode coupled to said transmission line, and a resistor coupled to said transmission line at an arcuate distance from said diode substantially equal to one quarter of a wavelength at said predetermined operating frequency, said resistor having a resistance value smaller than the absolute value of the minimum negative resistance of said diode and adapted to receive a bias voltage to bias said diode to exhibit negative resistance, said characteristic impedance of said transmission line being substantially equal to the value of said resistor.

4. A high frequency signal translating circuit tunable over a broad band of microwave frequencies about a predetermined mean operating frequency comprising in combination a resonant reentrant transmission line including a pair of annular conductors, said conductors having a mean circumference which is substantially equal to one wavelength at said predetermined mean operating frequency, an active element comprising a negative resistance diode coupled to said transmission line, a resistor coupled to said transmission line at a spaced arcuate distance from said diode, said resistor having a resistance smaller than the absolute value of the minimum negative resistance of said diode and adapted to receive a voltage to bias said diode to exhibit a negative resistance, a stub tuning line including a pair of parallel conductors having a given electrical length coupled to said reentrant transmission line in parallel with said diode, and means for changing the electrical length of said stub tuning line terminating said stub tuning line.

5. A high frequency circuit having a predetermined mean operating frequency comprising in combination a resonant reentrant transmission line including a pair of annular conductors having a given mean circumference, a voltage controlled negative resistance device coupled to said transmission line, a resistor coupled to said transmission line at an arcuate distance from said negative resistance device such that the arcuate distance from said device to said resistor in one direction around the circumference of said transmission line minus the arcuate distance from said device to said resistor in the opposite direction is substantially equal to one half of a wavelength at the said predetermined operating frequency.

6. A high frequency circuit tunable over a band of frequencies comprising in combination a plurality of resonant reentrant transmission lines each having a pair of annular conductors, said transmission lines being joined together at a junction to form a parallel circuit, a negative resistance diode coupled to said transmission lines at said junction as an active element in common for both lines, a stabilizing resistor in each of said transmission lines, said resistors being substantially equal in resistance value and smaller than the absolute value of the minimum negative resistance of said diode, and adapted to receive a voltage to bias said diode to exhibit a negative resistance, a stub tuning line coupled to said transmission lines at the junction of said transmission lines, and a variable capacitor terminating said stub tuning line whereby said transmission lines may be tuned together over said band of frequencies.

7. A high frequency circuit tunable over a broad band of frequencies comprising in combination a first resonant reentrant transmission line having a pair of annular conductors of a first mean circumference, a second resonant reentrant transmission line having a pair of annular conductors of a second mean circumference, said first and second reentrant transmission lines having first and second characteristic impedances respectively, said transmission lines being joined together at a junction to form a parallel circuit, a negative resistance diode coupled to said first and second transmission lines at their junction as an active element in both transmission lines, first and second biasing resistors of substantially equal value for said first and second transmission lines respectively, said resistors being smaller than the absolute value of the minimum negative resistance of said diode and adapted to receive a biasing voltage to bias said diode to exhibit a negative resistance, a stub tuning line coupled to said transmission lines at their junction in parallel with said diode, and a variable capacitor terminating said stub tuning line to tune said reentrant transmission lines together over the same band of frequencies.

8. A radial circuit resonant at a predetermined frequency comprising in combination a pair of substantially parallel, coaxial, and circular conductive discs having a given radius, a resistor coupled to said conductive discs at substantially the center thereof, an active element for said circuit comprising a negative resistance diode coupled to said conductive discs, said resistor having a smaller resistance than the absolute value of the minimum negative resistance of said diode and adapted to receive a voltage to bias said diode to exhibit a negative resistance, said diode being coupled to said conductive discs at a radial distance from said resistor such that at said predetermined frequency the loading presented by said resistor to said diode is a minimum.

9. A radial circuit resonant at a predetermined frequency comprising in combination a pair of substantially parallel coaxial and circular conductive discs having a given radius, a resistor coupled to said conductive discs at substantially the center thereof, a negative resistance diode coupled to said conductive discs to comprise the active element of said resonant circuit, said resistor having a smaller resistance than the absolute value of the minimum negative resistance of said diode and adapted to receive a voltage to bias said diode to exhibit a negative resistance, said diode being coupled to said conductive discs at a radial distance from said resistor substantially equal to one-quarter of a wavelength at said predetermined frequency.

References Cited in the file of this patent

IBM Technical Disclosure Bulletin: vol. 2, No. 6 of April 1960, pages 71 and 72 relied on (Slobodzinski).